United States Patent
Lee et al.

(10) Patent No.: US 11,950,353 B2
(45) Date of Patent: Apr. 2, 2024

(54) BATTERY MANAGEMENT SYSTEM CIRCUIT

(71) Applicant: LG CHEM, LTD., Seoul (KR)

(72) Inventors: Ki Young Lee, Daejeon (KR); Wongon Kim, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 548 days.

(21) Appl. No.: 17/273,455

(22) PCT Filed: Mar. 9, 2020

(86) PCT No.: PCT/KR2020/003255
§ 371 (c)(1),
(2) Date: Mar. 4, 2021

(87) PCT Pub. No.: WO2020/218735
PCT Pub. Date: Oct. 29, 2020

(65) Prior Publication Data
US 2021/0345480 A1   Nov. 4, 2021

(30) Foreign Application Priority Data

Apr. 25, 2019   (KR) .................. 10-2019-0048580

(51) Int. Cl.
*H05K 1/02*     (2006.01)
*H01M 10/42*    (2006.01)

(52) U.S. Cl.
CPC ........ *H05K 1/0209* (2013.01); *H01M 10/425* (2013.01); *H01M 2010/4271* (2013.01); *H05K 2201/10022* (2013.01)

(58) Field of Classification Search
None
See application file for complete search history.

(56) References Cited

U.S. PATENT DOCUMENTS

| | | | |
|---|---|---|---|
| 4,658,234 | A  | 4/1987  | Takayanagi |
| 10,270,141 | B2 | 4/2019  | Piggott et al. |
| 10,784,546 | B2 | 9/2020  | Piggott et al. |
| 2008/0050645 | A1 | 2/2008  | Kai et al. |
| 2010/0290183 | A1 | 11/2010 | Rijken et al. |
| 2012/0052345 | A1 | 3/2012  | Kai et al. |

(Continued)

FOREIGN PATENT DOCUMENTS

| | | |
|---|---|---|
| CN | 206365129 U | 7/2017 |
| DE | 10 2008 060 487 A1 | 6/2010 |

(Continued)

OTHER PUBLICATIONS

International Search Report issued in PCT/KR2020/003255 (PCT/ISA/210), dated Jul. 3, 2020.

*Primary Examiner* — Wyatt P McConnell
(74) *Attorney, Agent, or Firm* — Birch, Stewart, Kolasch & Birch, LLP

(57) ABSTRACT

Disclosed is a battery management system circuit, including: a substrate; a first resistor part disposed on the substrate and including a plurality of resistors; a second resistor part disposed on the substrate and including a plurality of resistors; and a first perforation formed by piercing the substrate between the first resistor part and the second resistor part, and the first perforation diffuses heat generated by the first resistor part and the second resistor part.

12 Claims, 4 Drawing Sheets

(56) References Cited

U.S. PATENT DOCUMENTS

2013/0108894 A1* 5/2013 Jung .................. H01M 50/209
429/7
2019/0320549 A1* 10/2019 Song ................. H05K 7/14329

FOREIGN PATENT DOCUMENTS

| | | |
|---|---:|---:|
| JP | 3-296292 A | 12/1991 |
| JP | 4-255289 A | 9/1992 |
| JP | 2005-223078 A | 8/2005 |
| JP | 2006-173243 A | 6/2006 |
| JP | 2009-50155 A | 3/2009 |
| JP | 2011-511455 A | 4/2011 |
| JP | 2012-204783 A | 10/2012 |
| JP | 2013-230024 A | 11/2013 |
| JP | 2017-50478 A | 3/2017 |
| JP | 6184242 B2 | 8/2017 |
| KR | 10-0397161 B1 | 3/2004 |
| KR | 20-0349181 Y1 | 9/2004 |
| KR | 10-2015-0126837 A | 11/2015 |
| KR | 10-1658025 B1 | 9/2016 |
| KR | 10-1733088 B1 | 5/2017 |
| WO | WO 2011/024477 A1 | 3/2011 |

* cited by examiner

_(1)_

BATTERY MANAGEMENT SYSTEM CIRCUIT

CROSS-REFERENCE TO RELATED APPLICATION(S)

This application claims priority to and the benefit of Korean Patent Application No. 10-2019-0048580 filed in the Korean Intellectual Property Office on Apr. 25, 2019, the entire contents of which are incorporated herein by reference.

TECHNICAL FIELD

The present invention relates to a battery management system circuit.

BACKGROUND ART

Generally, a secondary battery capable of charging and discharging is widely used as a battery that is a power source for a wireless mobile device. Such a battery is also spotlighted as a power source for an electric vehicle (EV), a hybrid electric vehicle (HEV), and the like, which have been proposed as a solution for air pollution from a conventional gasoline or diesel vehicle using fossil fuels. When the battery is alternately charged or discharged, there is a need to efficiently manage the charging and discharging of the battery so that a proper operating condition and performance of the battery are maintained.

To this end, a battery management system (BMS) that manages a state and performance of the battery is provided in a battery pack. The BMS manages the battery by measuring a current, a voltage, a temperature, and the like of the battery, and recording them in a memory.

The battery may be susceptible to overheating, a cold temperature, an extreme temperature, and an operating temperature limit, and may sometimes cause serious malfunction when the battery is operating beyond a determined temperature range. In this case, the BMS maintains voltages of battery cells to similar levels by performing cell balancing.

In a case of an energy storage system (ESS) or BEV model including many cells, when the cell balancing is performed, a lot of heat is generated in a resistance part in which energy is consumed to be converted to a current or heat, and the generated heat affects stability of a BMS circuit. In addition, there is a problem in that a temperature of components around the BMS increases due to the generated heat, which adversely affects life of the components.

DISCLOSURE

Technical Problem

The present invention is to overcome the above problem, and a BMS circuit and a battery pack including the BMS circuit according to an embodiment effectively cool heat generated in the battery pack.

In addition, the BMS circuit and the battery pack induce heat diffusion of a BMS circuit board.

Further, the BMS circuit and the battery pack induce heat diffusion by connecting a chassis or an external medium to the BMS circuit board.

The technical objects of the present invention are not limited to the above, and other non-mentioned objects will be clearly understood by a person of ordinary skill in the art by way of the following description.

Technical Solution

An embodiment provides a BMS circuit, and the BMS circuit includes: a substrate; a first resistor part disposed on the substrate and a second resistor part disposed on the substrate and including a plurality of resistors; and a first perforation formed by piercing the substrate between the first resistor part and the second resistor part, the first perforation may be configured to diffuse heat generated by the first resistor part and the second resistor part.

The BMS circuit may further include: a second perforation formed by piercing the substrate at a position corresponding to a side surface of the first resistor part; and a second perforation formed by piercing the substrate at a position corresponding to a side surface of the second resistor part, the second perforation may be configured to diffuse heat generated in the first resistor part, and the third perforation may be configured to diffuse heat generated in the second resistor part.

The BMS circuit may further include: a first thermal pad attached to a plurality of resistors included in the first resistor part; and a second thermal pad attached to a plurality of resistors included in the second resistor part, the first thermal pad may be configured to conduct heat away from the first resistor through the first and second perforations, and the second thermal pad may be configured to conduct heat away from the second resistor part through the second and third perforations.

The first thermal pad of the BMS circuit may be wound at least once around the first resistor part, and the second thermal pad may be wound at least twice around the second resistor part.

The BMS circuit may further include: a controller configured to control the BMS circuit; a connector configured to electrically connect the BMS circuit to the outside; and a current path configured to connect the controller, the first resistor part, the second resistor part, and the connector.

Another embodiment provides a BMS circuit, and the BMS includes: a substrate; a first resistor part disposed on the substrate and including a plurality of resistors; and a first perforation formed by piercing the substrate at positions corresponding to three surfaces of the first resistor part, the first perforation may be configured to diffuse heat generated in the first resistor part.

The first perforation may be formed to have a "U" shape.

The BMS circuit may further include: a second resistor part including a plurality of resistors, and the "U" shape of the first perforation corresponds to one side surface of the first resistor part, a lower surface of the first resistor part, a lower surface of the second resistor part, and one side surface of the second resistor part.

The BMS circuit may further include: a controller configured to control the BMS circuit; a connector configured to electrically connect the BMS circuit to the outside; and a current path configured to connect the controller, the first resistor part, and the connector.

Another embodiment provides a BMS circuit, and the BMS includes: a substrate; a first resistor part disposed on the substrate and including a plurality of resistors; a first perforation formed by piercing the substrate at a position corresponding to a first surface of the first resistor part; and a first thermal pad attached to a plurality of resistors included in the first resistor part, the first perforation may be configured to diffuse heat generated in the first resistor part, and the first thermal pad, while penetrating through the first perforation, may be wound at least once around the first resistor part and a lower side of the substrate.

The BMS circuit may further include: a second resistor part including a plurality of resistors; and a third resistor part including a plurality of resistors, and the first thermal pad, while penetrating through the first perforation, may be wound at least once around the second resistor part, the third resistor part, and a lower surface of the substrate.

The BMS circuit may further include: a controller configured to control the BMS circuit; a connector configured to electrically connect the BMS circuit to the outside; and a current path configured to connect the controller, the first resistor part, and the connector.

Advantageous Effects

According to the BMS circuit according to the present invention and the battery pack including the BMS circuit, it is possible to effectively cool heat generated in the battery pack.

In addition, it is possible to induce heat diffusion of the BMS circuit board.

Further, it is possible to induce heat diffusion by connecting a chassis or an external medium to the BMS circuit board.

MODE FOR INVENTION

Figure 1:
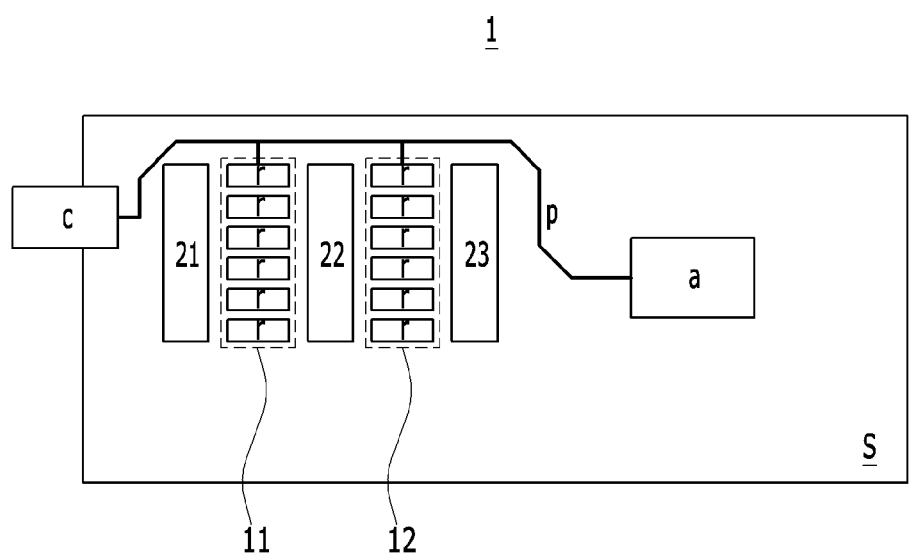
FIG. 1 illustrates a BMS circuit according to a first embodiment.

Hereinafter, embodiments disclosed in the present specification will be described in detail with reference to the accompanying drawings. In the present specification, the same or similar constituent elements will be denoted by the same or similar reference numerals, and an overlapped description thereof will be omitted. The terms "module" and "unit" representing constituent elements used in the following description are used only in order to make understanding of the specification easier. Therefore, these terms do not have meanings or roles that distinguish them from each other by themselves. In addition, in describing embodiments of the present specification, when it is determined that a detailed description of the well-known art associated with the present invention may obscure the gist of the present invention, it will be omitted. Further, the accompanying drawings are provided only in order to allow embodiments disclosed in the present specification to be easily understood, and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various constituent elements, and are not to be interpreted as limiting these constituent elements. The terms are only used to differentiate one constituent element from other constituent elements.

It is to be understood that when one constituent element is referred to as being "connected" or "coupled" to another constituent element, it may be connected or coupled directly to the other constituent element or be connected or coupled to the other constituent element with a further constituent element intervening therebetween. On the other hand, it is to be understood that when one constituent element is referred to as being "connected or coupled directly" to another constituent element, it may be connected to or coupled to the other constituent element without another constituent element intervening therebetween.

Singular forms are intended to include plural forms unless the context clearly indicates otherwise.

It will be further understood that terms "comprises" or "have" used in the present specification specify the presence of stated features, numerals, steps, operations, constituent elements, parts, or a combination thereof, but do not preclude the presence or addition of one or more other features, numerals, steps, operations, constituent elements, parts, or a combination thereof.

FIG. 1 illustrates a BMS circuit according to a first embodiment.

Hereinafter, a structure of the BMS circuit according the first embodiment will be described with reference to FIG. 1.

Referring to FIG. 1, a BMS circuit 1 includes, on a substrate S, a controller a, a first resistor part 11 including a plurality of resistors r, a second resistor part 12 including a plurality of resistors r, a connector c that electrically connects the BMS circuit 1 to the outside, and a current path p connecting the controller a, the first resistor part 11, the second resistor part 12, and the connector.

The controller a may be configured to control charging/discharging performed by the BMS circuit 1, and may be formed as an ASIC circuit, but is not limited thereto.

On the substrate S, a first perforation 21 is formed at one side surface of the first resistor part 11, a second perforation 22 is formed between the first resistor part 11 and the second resistor part 12, and a third perforation 23 may be formed at one side surface of the second resistor part 12. The substrate S may be a PCB substrate, but is not limited thereto.

The first to third perforations 21, 22, and 23 may be formed to extend in a longitudinal direction (a vertical direction of FIG. 1) of the first resistor part 11 and the second resistor part 12, but embodiments are not limited thereto.

The first to third perforations 21, 22, and 23 may be formed by forming a hole in the substrate S so that heat generated from each of the plurality of resistors r is diffused to be efficiently discharged.

Hereinafter, a structure of a BMS circuit according a second embodiment will be described with reference to FIG. 2.

Figure 2:
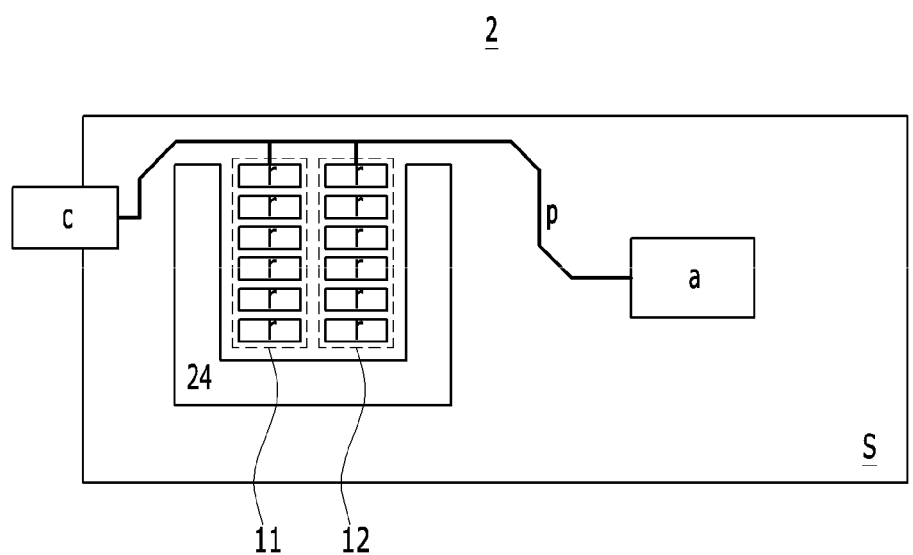
FIG. 2 illustrates a BMS circuit according to a second embodiment.

FIG. 2 illustrates the BMS circuit according to the second embodiment.

Referring to FIG. 2, a BMS circuit 2 includes, on a substrate S, a controller a, a first resistor part 11 including a plurality of resistors r, a second resistor part 12 including a plurality of resistors r, a connector c that electrically connects the BMS circuit 1 to the outside, and a current path p connecting the controller a, the first resistor part 11, the second resistor part 12, and the connector c.

The controller a, the first resistor part 11, and the second resistor part 12 mounted on the BMS circuit 2 according to the second embodiment are the same as those mounted on the BMS circuit 1 according to the first embodiment, but their positions are different.

A fourth perforation 24 having a "U" shape surrounding one side surface of the first resistor part 11 (for example, the left side surface thereof), a lower side of the first resistor part 11 and the second resistor part 12, and one side surface of the second resistor part 12 (for example, the right side surface thereof) may be formed on the substrate S.

The fourth perforation 24 may be formed by forming a hole in the substrate S so that heat generated from each of the plurality of resistors r is diffused to be efficiently discharged.

Figure 3:
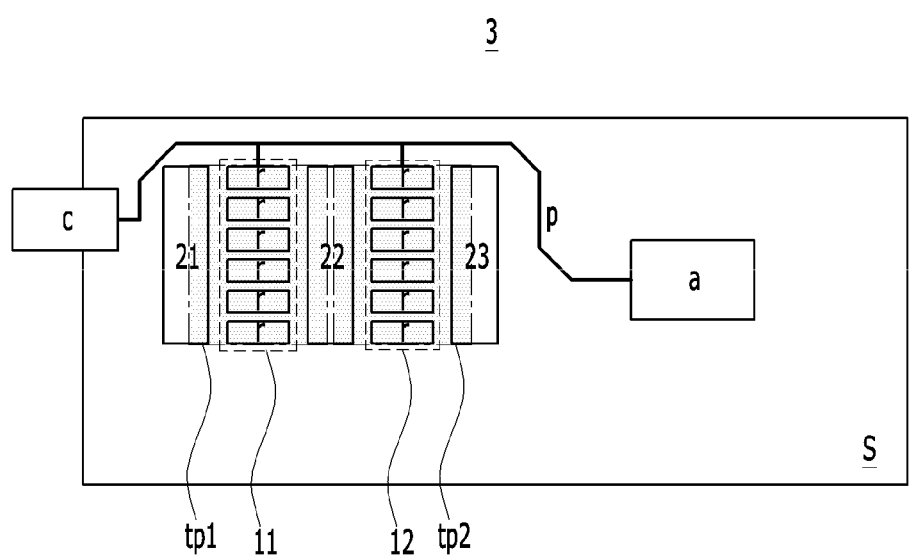
FIG. 3 illustrates a BMS circuit according to a third embodiment.

FIG. 3 illustrates a BMS circuit according to a third embodiment.

Hereinafter, a structure of the BSM circuit according the third embodiment will be described with reference to FIG. 3.

Referring to FIG. 3, a BMS circuit 3 includes, on a substrate S, a controller a, a first resistor part 11 including a plurality of resistors r, a second resistor part 12 including a plurality of resistors r, a connector c that electrically connects the BMS circuit 1 to the outside, and a current path p connecting the controller a, the first resistor part 11, the second resistor part 12, and the connector.

The controller a, the first resistor part 11, and the second resistor part 12 mounted on the BMS circuit 3 according to the third embodiment are the same as those mounted on the BMS circuit 1 according to the first embodiment, and the first to third perforations 21, 22, and 23 formed in the first and third embodiments are also the same.

The BMS circuit 3 may further include a first thermal pad tp1 and a second thermal pad tp2.

The first thermal pad tp1 may be attached to an upper surface of the first resistor part 11 so that heat of the plurality of resistors r may be efficiently conducted to be diffused through the first perforation 21 and the second perforation 22.

In addition, the first thermal pad tp1 is wound at least once on the first resistor part 11 while penetrating through the first perforation 21 and the second perforation 22 so as to be attached to each surface of the first resistor part 11 based on the first resistor part 11, but embodiments are not limited thereto.

The second thermal pad tp2 is attached to an upper surface of the second resistor part 12 such that heat of the plurality of resistors r is efficiently conducted. Therefore, the heat of the plurality of resistors r may be diffused through the second perforation 22 and the third perforation 23.

The second thermal pad tp2 is wound at least once on the second resistor part 12 while penetrating through the second perforation 22 and the third perforation 23 so as to be attached to each surface of the second resistor part 12 based on the second resistor part 12, but embodiments are not limited thereto.

Figure 4:
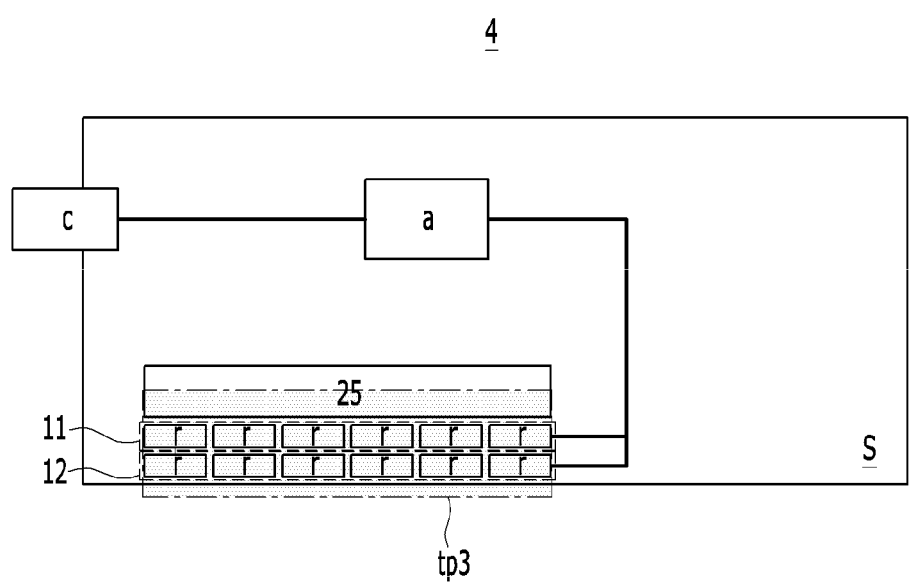
FIG. 4 illustrates a BMS circuit according to a fourth embodiment.

FIG. 4 illustrates a BMS circuit according to a fourth embodiment.

Hereinafter, the BMS circuit according the fourth embodiment will be described with reference to FIG. 4.

Referring to FIG. 4, a BMS circuit 4 includes, on a substrate S, a controller a, a first resistor part 11 including a plurality of resistors r, a second resistor part 12 including a plurality of resistors r, a connector c that electrically connects the BMS circuit 1 to the outside, and a current path p connecting the controller a, the first resistor part 11, the second resistor part 12, and the connector.

The controller a, the first resistor part 11, and the second resistor part 12 mounted on the BMS circuit 4 according to the fourth embodiment are the same as those mounted on the BMS circuit 1 according to the first embodiment, but their positions are different.

The first resistor part 11 and the second resistor part 12 may be disposed in a direction (a horizontal direction in FIG. 4) parallel to the substrate S at a lower position of the substrate S of the BMS circuit 4, and a fifth perforation 25 may be formed on the substrate S at a position corresponding to an upper position of the first resistor part 11.

The fifth perforation 25 may be generated by forming a hole in the substrate S in a longitudinal direction parallel to the first resistor part 11 and the second resistor part 12 so that heat generated from each of the plurality of resistors r may be diffused to be efficiently discharged.

The BMS circuit 4 may include a third thermal pad tp3.

The third thermal pad tp3 is attached to an upper surface each of the first resistor part 11 and the second resistor part 12 such that heat of the plurality of resistors r is efficiently conducted. Therefore, the heat of the plurality of resistors r may be diffused through the fifth perforation 25.

In addition, the third thermal pad tp3 may have a shape wound at least once around the first resistor part 11, the second resistor part 12, and the lower surfaces of the substrate S while penetrating through the fifth perforation 25.

Specifically, the third thermal pad tp3 is wound around the first resistor part 11 and the second resistor part 12 so that it is attached to upper surfaces of the first resistor part 11 and the second resistor part 12, one side surface of the first resistor part 11, one side surface of the second resistor part 12, and lower surfaces of the first resistor part 11 and the second resistor part 12, but embodiments are not limited thereto.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, the above-detailed description is not to be interpreted as being restrictive, but is to be considered as being illustrative. The scope of the present invention is to be determined by reasonable interpretation of the claims, and all alterations within equivalences of the present invention fall within the scope of the present invention.

The invention claimed is:

1. A battery management system circuit, comprising:
   a substrate;
   a first resistor part disposed on the substrate and including a plurality of resistors;
   a second resistor part disposed on the substrate and including a plurality of resistors; and
   a first perforation formed by piercing the substrate between the first resistor part and the second resistor part, the first perforation disposed between the first resistor part and the second resistor part in a horizontal direction parallel to the substrate,
   wherein the first perforation is configured to diffuse heat generated by the first resistor part and the second resistor part,
   wherein the first resistor part is spaced from the second resistor part and the first perforation in the horizontal direction, and
   wherein the first resistor part does not overlap the first perforation.

2. The battery management system circuit of claim 1, further comprising:

a second perforation formed by piercing the substrate at a position corresponding to a side surface of the first resistor part; and a third perforation formed by piercing the substrate at a position corresponding to a side surface of the second resistor part, wherein the second perforation is configured to diffuse heat generated in the first resistor part, and wherein the third perforation is configured to diffuse heat generated in the second resistor part.

3. The battery management system circuit of claim 2, further comprising:

a first thermal pad attached to a plurality of resistors included in the first resistor part; and a second thermal pad attached to a plurality of resistors included in the second resistor part, wherein the first thermal pad is configured to conduct heat away from the first resistor part through the first and second perforations, and wherein the second thermal pad is configured to conduct heat away from the second resistor part through the second and third perforations.

4. The battery management system circuit of claim 3, wherein the first thermal pad is wound at least once around the first resistor part while penetrating the first perforation, and the second thermal pad is wound at least twice around the second resistor part while penetrating the second perforation.

5. The battery management system circuit of claim 1, further comprising:

a controller configured to control the battery management system circuit;

a connector configured to electrically connect the battery management system circuit to the outside; and a current path configured to connect the controller, the first resistor part, the second resistor part, and the connector.

6. A battery management system circuit, comprising:

a substrate;

a first resistor part disposed on the substrate and including a plurality of resistors; and a first perforation formed by piercing the substrate at positions corresponding to three surfaces of the first resistor part, the positions being spaced apart in a horizontal direction parallel to the substrate, wherein the first perforation is configured to diffuse heat generated in the first resistor part, wherein the first resistor part is spaced from the first perforation in the horizontal direction, and wherein the first resistor part does not overlap the first perforation.

7. The battery management system circuit of claim 6, wherein the first perforation is formed to have a "U" shape.

8. The battery management system circuit of claim 7, further comprising a second resistor part including a plurality of resistors, wherein the "U" shape of the first perforation corresponds to one side surface of the first resistor part, a lower surface of the first resistor part, a lower surface of the second resistor part, and one side surface of the second resistor part.

9. The battery management system circuit of claim 6, further comprising:

a controller configured to control the battery management system circuit;

a connector configured to electrically connect the battery management system circuit to the outside; and a current path configured to connect the controller, the first resistor part, and the connector.

10. A battery management system circuit, comprising:

a substrate;

a first resistor part disposed on the substrate and including a plurality of resistors;

a first perforation formed by piercing the substrate at a position corresponding to a first surface of the first resistor part; and a first thermal pad attached to a plurality of resistors included in the first resistor part; and a third thermal pad attached to an upper surface of the first resistor part, wherein the first resistor part is spaced from the second resistor part and the first perforation in a horizontal direction parallel to the substrate, wherein the first resistor part does not overlap the first perforation, wherein the first perforation is configured to diffuse heat generated in the first resistor part, and wherein the third thermal pad, while penetrating through the first perforation, is wound at least once around the first resistor part and a lower surface of the substrate.

11. The battery management system circuit of claim 10, further comprising:

a second resistor part including a plurality of resistors; and a third resistor part including a plurality of resistors, wherein the first thermal pad, while penetrating through the first perforation, is wound at least once around the second resistor part, the third resistor part, and the lower surface of the substrate.

12. The battery management system circuit of claim 10, further comprising:

a controller configured to control the battery management system circuit;

a connector configured to electrically connect the battery management system circuit to the outside; and a current path configured to connect the controller, the first resistor part, and the connector.

\* \* \* \* \*